US007003006B2

(12) United States Patent
You et al.

(10) Patent No.: US 7,003,006 B2
(45) Date of Patent: Feb. 21, 2006

(54) GREEN DIODE LASER

(76) Inventors: Li-Ning You, 3F, Building 54, No. 1089 North Qin Zhou Road, Shanghai 200233 (CN); Wen-Zhao Zhang, 3F, Building 54, No. 1089 North Qin Zhou Road, Shanghai 200233 (CN); Xian-Wen Zheng, 3F, Building 54, No. 1089 North Qin Zhou Road, Shanghai 200233 (CN); Wen-Hu Xu, 3F, Building 54, No. 1089 North Qin Zhou Road, Shanghai 200233 (CN); Zheng-Hua Xu, 3F, Building 54, No. 1089 North Qin Zhou Road, Shanghai 200233 (CN); Yan-Ping Chen, 3F, Building 54, No. 1089 North Qin Zhou Road, Shanghai 200233 (CN); Shao-Feng Zhang, 3F, Building 54, No. 1089 North Qin Zhou Road, Shanghai 200233 (CN)

( * ) Notice: Subject to any disclaimer, the term of this patent is extended or adjusted under 35 U.S.C. 154(b) by 36 days.

(21) Appl. No.: 10/765,381

(22) Filed: Jan. 26, 2004

(65) Prior Publication Data
US 2005/0163176 A1 Jul. 28, 2005

(51) Int. Cl.
H01S 3/04 (2006.01)
H01S 3/13 (2006.01)
(52) U.S. Cl. .................... 372/36; 372/29.011

(58) Field of Classification Search ............ 372/29–36, 372/22
See application file for complete search history.

(56) References Cited

U.S. PATENT DOCUMENTS

| 3,963,347 | A | * | 6/1976 | Segre et al. ............... 356/5.01 |
| 4,260,957 | A | * | 4/1981 | Congleton et al. ............ 372/23 |
| 4,731,795 | A | * | 3/1988 | Clark et al. ................. 372/107 |
| 5,187,714 | A | * | 2/1993 | Okazaki et al. ............... 372/36 |
| 5,802,086 | A | * | 9/1998 | Hargis et al. ................. 372/22 |
| 5,872,803 | A | * | 2/1999 | Mori et al. .................... 372/75 |
| 6,130,901 | A | * | 10/2000 | Takamine et al. ............. 372/32 |
| 6,240,113 | B1 | * | 5/2001 | Peterson ....................... 372/36 |
| 6,567,435 | B1 | * | 5/2003 | Scott et al. ............ 372/29.021 |
| 2005/0063441 | A1 | * | 3/2005 | Brown ......................... 372/50 |

* cited by examiner

Primary Examiner—Wilson Lee
Assistant Examiner—Hung Tran Vy
(74) Attorney, Agent, or Firm—Raymond Y. Chan; David & Raymond

(57) ABSTRACT

A green diode laser includes a tubular laser casing, a heat sink sealedly mounted at the laser casing, a semiconductor chip supported by the heat sink, an optical resonant cavity supported within the laser casing, including a lasing medium and an intracavity frequency doubler, an IR blocking filter inclinedly and seadedly mounted at the laser casing to optically communicate with an output facet, and a photodiode supported within the laser casing at a position that when the laser beam exits the output facet, the IR blocking filter reflects a portion of the laser beam towards the photodiode such that the photodiode is adapted for detecting the laser beam from the IR blocking filter as a feedback for controlling a power output of the green laser chip.

23 Claims, 5 Drawing Sheets

GREEN DIODE LASER

BACKGROUND OF THE PRESENT INVENTION

1. Field of Invention

The present invention relates to a DPSS laser, and more particularly to a green DPSS laser wherein a volume and a weight thereof are significantly reduced with respect to conventional ones.

2. Description of Related Arts

Diode Pumped Solid State (DPSS) lasers have got increasingly popularly used due to their energy efficiency, high reliability, ruggedness, internal blanking and low Total Cost of Ownership (TCO). Their example applications include laser pointer, machining, material processing, spectroscopy, wafer inspection, light show, medical diagnostics and etc.

A typical green DPSS laser is as schematically shown in FIGS. 1A and 1B. The green DPSS laser consists of a laser diode (LD) that comprises a LD casing 101, a heat sink mounted within the LD casing 101, a semiconductor chip 102 mounted on the heat sink and an output window, which emitting a pumping radiation for exciting a lasing medium. A lens system 103 is mounted within a casing 106 for focusing of the pumping radiation. An optical resonant cavity, which is mounted within a cavity casing 108, includes a lasing medium 104 for a light amplication of 1064 nm in wavelength and an intracavity frequency doubler 105 for converting 1064 nm to 532 nm in wavelength, wherein the lasing medium 104 and the intracavity frequency doubler are separated with each other or being combined together. In other words, the LD casing 101, the lens system casing 106 and the cavity casing 108 are sealed in the casing 109. If the lasing medium 104 and the intracavity frequency doubler 105 are combined together, an anti-reflection coating at 808 nm (AR@808 nm) and a high-reflection coating at 532 nm (HR@532 nm) and 1064 nm (HR@1064 nm) are applied to an input facet facing the laser diode, and HR coating @1064 nm and AR coating @532 nm are applied to an output facet opposite to the input facet. When the lasing medium 104 and the intracavity frequency doubler 105 are discrete, AR coating @808 nm and HR coating @1064 nm and 532 nm are applied to the input facet of the lasing medium 104, and AR coating @1064 nm and 532 nm to an output facet of the lasing medium 104 opposite to the input facet thereof; while AR coating @1064 nm and 532 nm is applied to an input facet of the intracavity frequency doubler 105 facing the output facet of the lasing medium 104, and HR coating @1064 nm and an AR coating @532 are applied to an output facet of the intracavity frequency doubler 105 opposite to the input facet thereof.

The lasing medium 104 can be, most often, Nd:YAG or Nd:YVO$_4$, or another crystal. The intracavity frequency doubler 105 is usually KTP, KDP, LBO, BBO, ADP, LiIO3, or another non-linear material that is able to efficiently produce an output that is twice the frequency of the signal applied to its input.

Generally, a focusing optics (also known as "circularizing optics", must be inserted between the laser diode assembly and the optical resonant cavity for shaping the laser beam from the pump diode as round as possible.

An infrared (IR) blocking filter is provided in the path of the laser beam for removing the unwanted IR rays while providing excellent transmission for green wavelength. Optically, a Q-switch or a single mode device can also be inserted in the optical resonant cavity for making the laser into a pulse laser or a single longitudinal mode laser.

A photodiode is attached in the LD casing of the laser diode for receiving and sensing laser diode-generated pumping radiation and thus establishing a negative feedback for controlling the optical power output by the pump diode.

A photodiode is attached in the LD casing of the laser diode for receiving and sensing laser diode-generated pumping radiation and thus establishing a negative feedback for controlling the optical power output by the pump diode.

So, it is thought that if the optical resonant cavity, together with other wanted optics, can be put into within the casing of the laser diode before the semiconductor chip, the volume and weight of the whole DPSS laser will thus significantly minimized.

SUMMARY OF THE PRESENT INVENTION

A main object of the present invention is to provide a green DPSS laser, wherein a volume thereof is substantially smaller than a volume of the conventional ones.

Another object of the present invention is to provide a green DPSS laser, wherein a weight thereof is substantially less than a weight of the conventional ones.

Accordingly, in order to accomplish the above objects, the present invention provides a green diode laser, comprising:

a tubular laser casing having a first opening end and a second opening end;

a heat sink sealedly mounted at the first opening end of the laser casing;

a semiconductor chip supported by said heat sink for emitting a pumping radiation;

an optical resonant cavity supported within said laser casing, including a lasing medium to optically communicate with the semiconductor chip for a light amplification of fundamental frequency, and an intracavity frequency doubler to optically communicate with the lasing medium for frequency doubling of the fundamental frequency, wherein an input facet is formed at the lasing medium for the pumping radiation entering thereinto, an output facet is formed at the intracavity frequency doubler for the frequency-doubled beam exiting therefrom;

an IR blocking filter inclinedly and sealedly mounted at the second opening end of the laser casing to optically communicate with the output facet of the intracavity frequency doubler; and a photodiode supported by the heat sink at a position that when the frequency-doubled beam exits the output facet, the IR blocking filter reflects a portion of the frequency-doubled beam towards the photodiode such that the photodiode is adapted for detecting the frequency-doubled beam from the IR blocking filter as a feedback for controlling a power output of the optical resonant cavity.

These and other objectives, features, and advantages of the present invention will become apparent from the following detailed description, the accompanying drawings, and the appended claims.

DETAILED DESCRIPTION OF THE PREFERRED EMBODIMENT

Figure 1A:
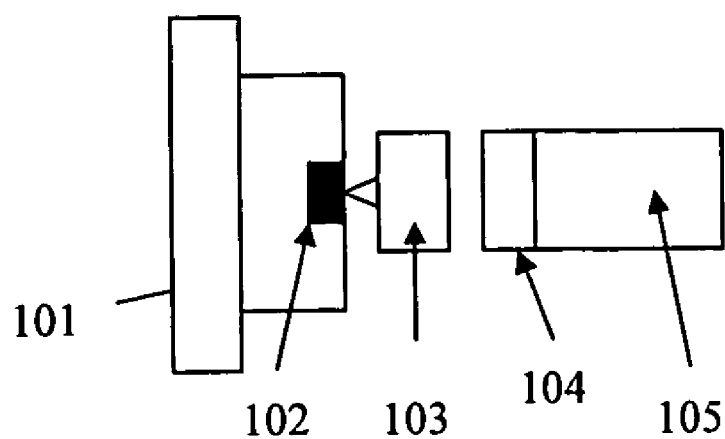
FIGS. 1A and 1B are conventional green DPSS laser.
Figure 1B:
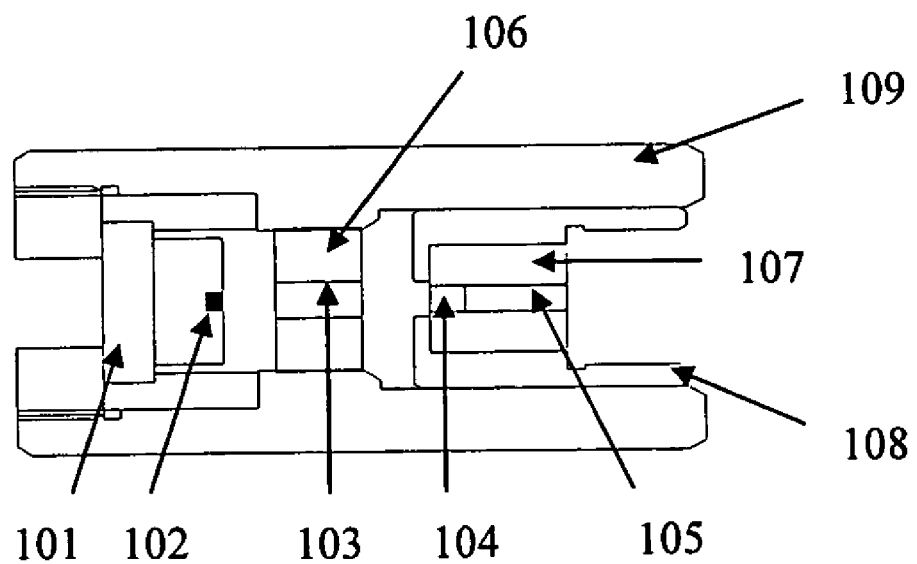
Figure 2A:
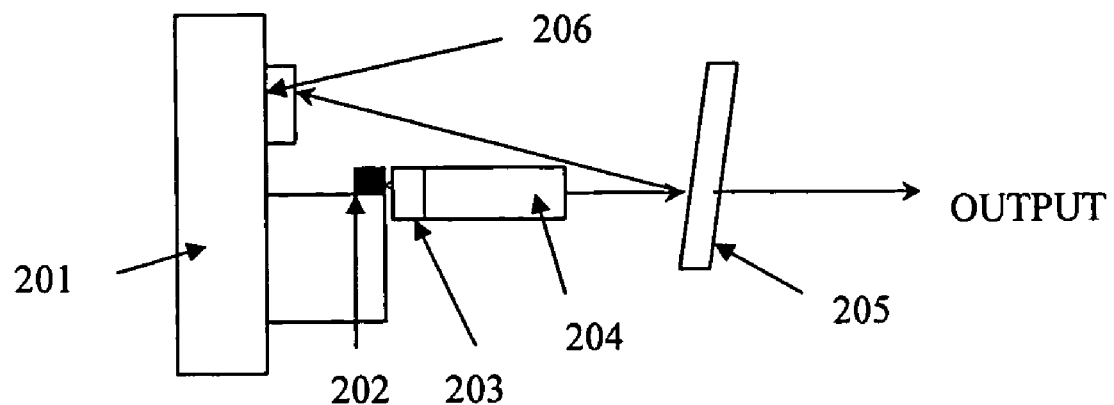
FIGS. 2A and 2B are schematic views of a green diode laser according to a preferred embodiment of the present invention.
Figure 2B:
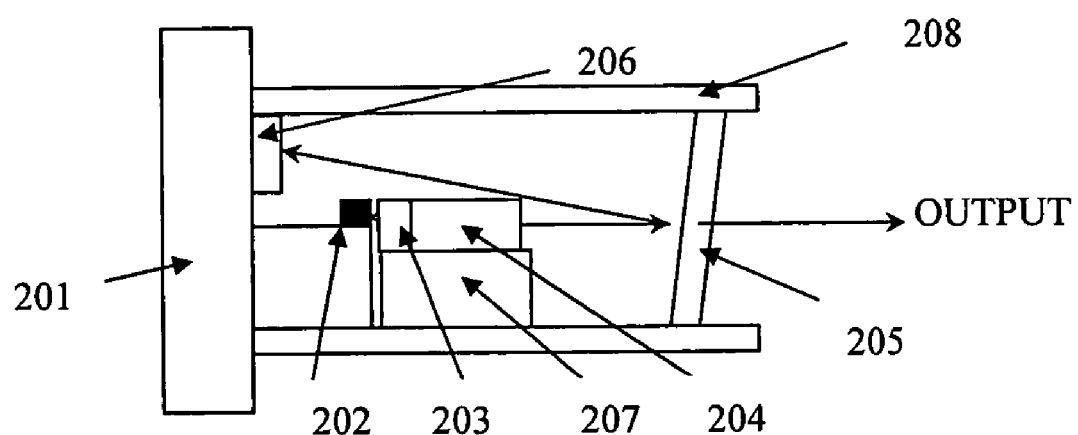

Referring to FIGS. 2A and 2B, a green diode laser according to a preferred embodiment of the present invention is illustrated, wherein the green diode laser comprises a tubular laser casing 208 having a first opening end and a second opening end, a heat sink 201 sealedly mounted at the first opening end of the laser casing 208.

The green diode laser further comprises a semiconductor chip 202 supported by the heat sink 201 for emitting a pumping radiation, and an optical resonant cavity supported within the laser casing 208. The optical resonant cavity comprises a lasing medium 203 to optically communicate with the semiconductor chip 202 for a light amplification of fundamental frequency, and an intracavity frequency doubler 204 to optically communicate with the lasing medium 203 for frequency doubling of the fundamental frequency, wherein an input facet is formed at the lasing medium 203 for the pumping radiation entering thereinto, an output facet is formed at the intracavity frequency doubler 204 for the frequency-double beam exiting therefrom. The optical resonant cavity is defined between the inner and output facets.

The green diode laser further comprises an IR blocking filter 205 inclinedly and sealedly mounted at the second opening end of the laser casing 208 to optically communicate with the output facet, and a photodiode 206 supported within the laser casing 208 at a position that when the laser beam exits the output facet, the IR blocking filter 205 reflects a portion of the laser beam towards the photodiode 206 such that the photodiode 206 is adapted for detecting the laser beam from the IR blocking filter 205 as a feedback for controlling a power output of the optical resonant cavity. In other words, the IR blocking filter is inclinedly and sealedly mounted at the second opening end of the laser casing 208 to optically communicate with the output facet of the intracavity frequency doubler 204.

The lasing medium 203 can be, most often, Nd:YAG, Nd:YVO$_4$, or Nd:GdVO$_4$ or another crystal that amplifies the input light that passes through it.

The intracavity frequency doubler 204 is usually KTP, KDP, LBO, BBO, ADP, LiIO3, or another non-linear material that is able to efficiently produce an output that is twice the frequency of the signal applied to its input.

According to the preferred embodiment, the lasing medium 203 and the intracavity frequency doubler 204 are combined together, wherein the input facet of the lasing medium 203 is coated with a coating having a high transmissivity at a wavelength of 808 nm and a high reflectance at wavelength of 1064 nm and 532 nm while the output facet of the intracavity frequency doubler 204 is coated with a coating having a high transmissivity at a wavelength of 532 nm and a high reflectance at a wavelength of 1064 nm.

The photodiode 206 has a light detecting surface for receiving the laser beam from the IR blocking filter 205. The light detecting surface of the photodiode 206 is coated with a coating having a high transmissivity at a wavelength of 532 nm and a high reflectance at wavelength of 1064 nm and 808 nm. Alternatively, a lens filter having a high transmissivity at a wavelength of 532 nm, and a high reflectance at wavelength of 1064 nm and 808 nm is covered on the light detecting surface of the photodiode 206.

Figure 3A:
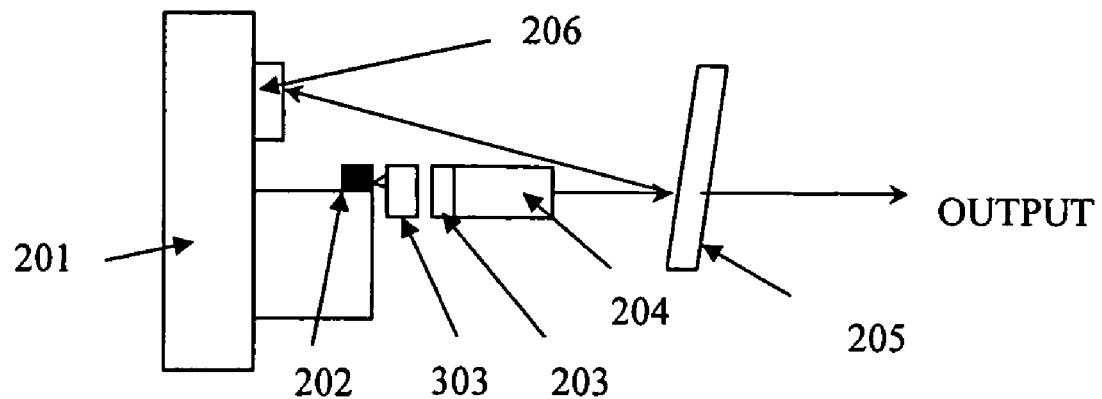
FIGS. 3A and 3B illustrate a first alternative mode of the green diode laser according to the above preferred embodiment of the present invention.
Figure 3B:
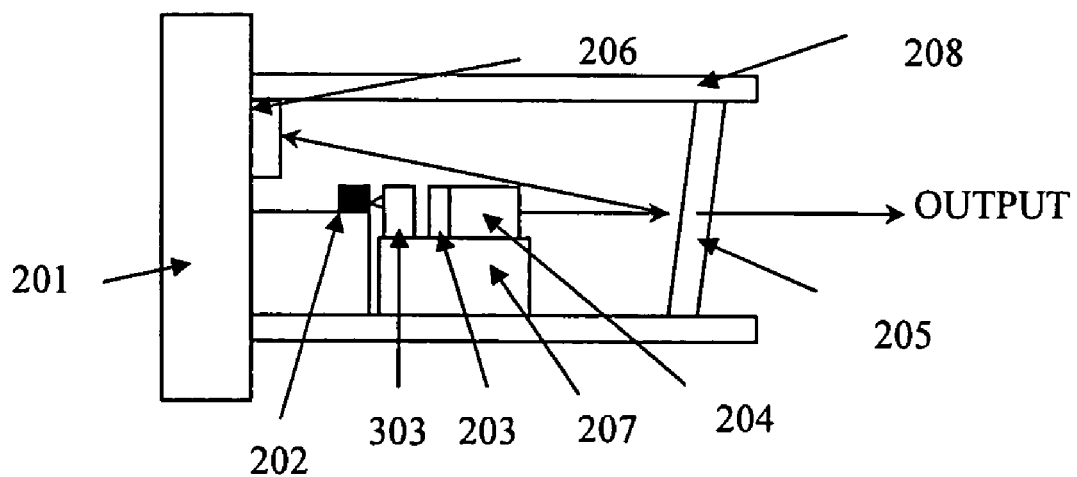

As shown in FIGS. 3A and 3B, a focusing device 303 is mounted between the semiconductor chip 202 and the input facet of the lasing medium 203 for focusing of the pumping radiation.

Figure 4:
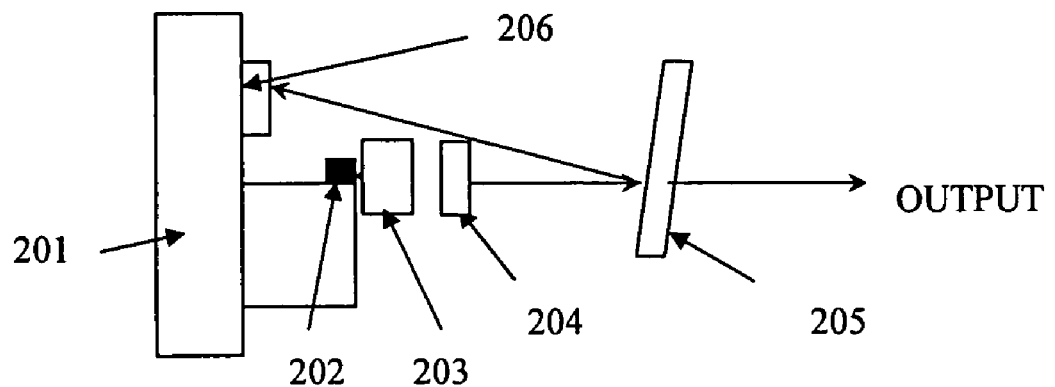
FIG. 4 illustrates a second alternative mode of the green diode laser according to the above preferred embodiment of the present invention.

As shown in FIG. 4, the lasing medium 203 and the intracavity frequency doubler 204 are spaced apart from each other, wherein the input facet of the lasing medium 203 is coated with a coating having a high transmissivity at a wavelength of 808 nm and a high reflectance at wavelength of 1064 nm and 532 nm while a facet of the lasing medium opposite to said input facet is coated with a coating having a high transmissivity at wavelength of 1064 nm and 532 nm.

The output facet of the intracavity frequency doubler 204 is coated with a coating having a high transmissivity at a wavelength of 532 nm and a high reflectance at a wavelength of 1064 nm while a facet of the intracavity frequency doubler 204 opposite to the output facet is coated with a coating having a high transmissivity at a wavelength of 1064 nm and 532 nm.

Figure 5:
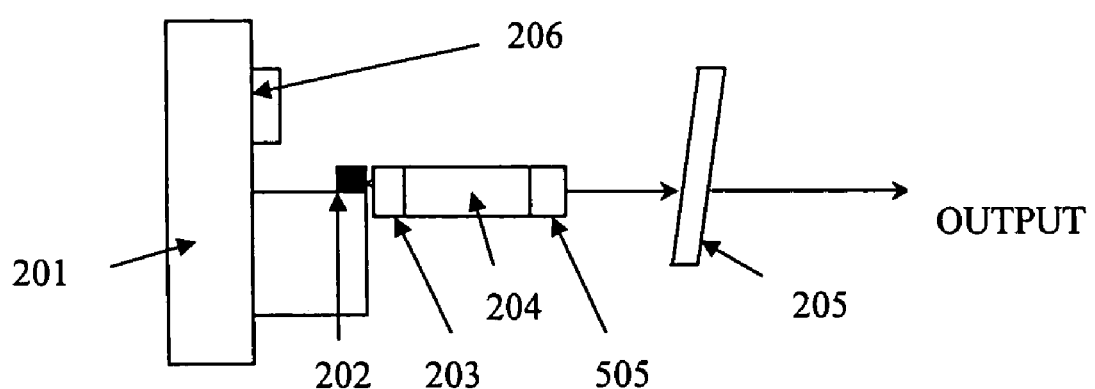
FIG. 5 illustrates a third alternative mode of the green diode laser according to the above preferred embodiment of the present invention.

As shown in FIG. 5, a Q-switch 505 is mounted between the intracavity frequency doubler 204 and IR blocking filter 205 within the laser casing 208 for converting the laser beam into a pulse laser.

Figure 6:
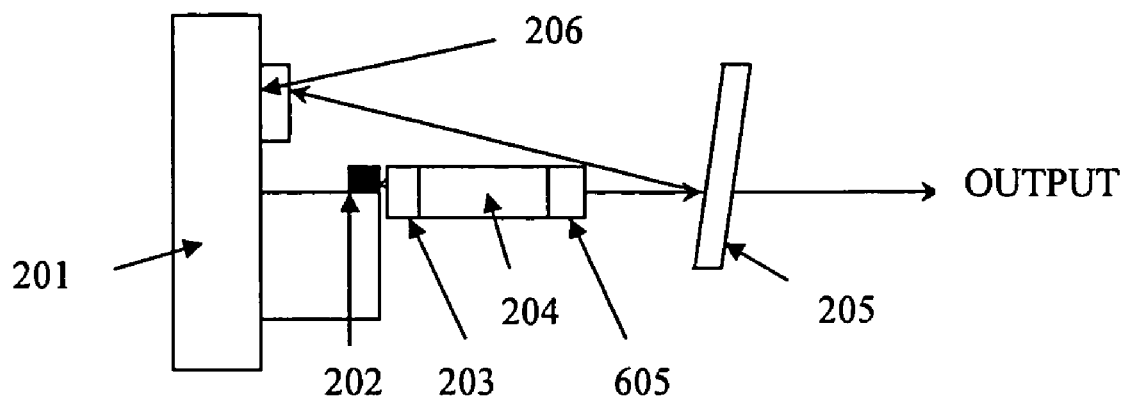
FIG. 6 illustrates a fourth alternative mode of the green diode laser according to the above preferred embodiment of the present invention.

As shown in FIG. 6, a single mode device 605 is mounted between the intracavity frequency doubler 204 and the IR blocking filter 205 within the laser casing 208 for converting the laser into a single longitudinal mode laser.

Figure 7:
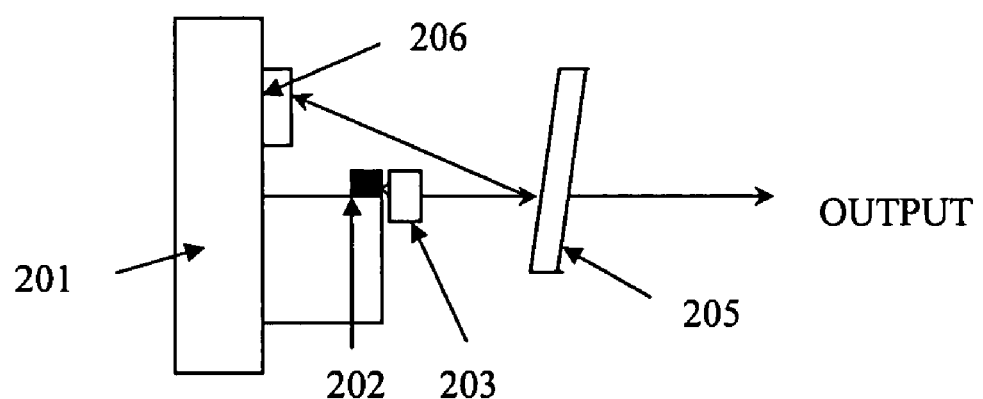
FIG. 7 illustrates a fifth alternative mode of the green diode laser according to the above preferred embodiment of the present invention.

As shown in FIG. 7, when the intracavity frequency doubler 204 is omitted, an infrared light at 1064 nm is output. Accordingly, a 808 nm anti-reflection layer and a 1064 nm high-reflection layer are respectively coated at the input facet of the lasing medium 203 while a 1064 nm high-reflection layer is coated at the output facet of the lasing medium 203, wherein an optical resonant cavity is defined between the input and output facets. In addition, a 1064 nm anti-reflection layer and a 808 nm high reflection layer are respectively coated at the light detecting surface of the photodiode 206. Therefore, the photodiode 206 is adapted for detecting the infrared light from the IR blocking filter 205 as a feedback for controlling a power output of the optical resonant cavity.

From above disclosure, it could be seen that by installing and supporting the resonant cavity and the necessary optics within the laser casing 208 of an existing laser diode (LD), a volume and weight of the present invention will be substantially reduced.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A green Diode laser, comprising:
   a tubular laser casing having a first opening end and a second opening end;
   a heat sink sealedly mounted at said first opening end of said laser casing;
   a semiconductor chip supported by said heat sink for emitting a pumping radiation;
   an optical resonant cavity supported within said laser casing, including a lasing medium supported by said laser casing to optically communicate with said semiconductor chip for a light amplification of fundamental frequency, and an intracavity frequency doubler supported by said laser casing to optically communicate with said lasing medium for frequency doubling of said fundamental frequency, wherein an input facet is formed at said lasing medium for said pumping radiation entering thereinto, an output facet is formed at said intracavity frequency doubler for said frequency-double beam exiting therefrom;
   an IR blocking filter inclinedly and sealedly mounted at said second opening end of said laser casing to optically communicate with said output facet of said intracavity frequency doubler; and
   a photodiode supported by said heat sink at a position that when said frequency-double beam exits said output facet, said IR blocking filter reflects a portion of said frequency-double beam towards said photodiode such that said photodiode is adapted for detecting said frequency-double beam from said IR blocking filter as a feedback for controlling a power output of said optical resonant cavity.

2. The green diode laser, as recited in claim 1, wherein said lasing medium and said intracavity frequency doubler are combined together, wherein said input facet of said lasing medium is coated with a coating having a high transmissivity at a wavelength of 808 nm and a high reflectance at wavelength of 1064 nm and 532 nm while said output facet of said intracavity frequency doubler is coated with a coating having a high transmissivity at a wavelength of 532 nm and a high reflectance at a wavelength of 1064 nm.

3. The green diode laser, as recited in claim 2, wherein a filter having a high transmissivity at a wavelength of 532 nm and a high reflectance at wavelength of 1064 nm and 808 nm is covered on the light detecting surface of the photodiode.

4. The green diode laser, as recited in claim 3, wherein said intracavity frequency doubler is KTP.

5. The green diode laser, as recited in claim 4, wherein said lasing medium is Nd:YVO$_4$.

6. The green diode laser, as recited in claim 5, further comprising a focusing device mounted between said semiconductor chip and said input facet of said lasing medium for focusing of said pumping radiation.

7. The green diode laser, as recited in claim 4, wherein said lasing medium is Nd:GdVO$_4$.

8. The green diode laser, as recited in claim 7, further comprising a focusing device mounted between said semiconductor chip and said input facet of said lasing medium for focusing of said pumping radiation.

9. The green diode laser, as recited in claim 2, wherein a light detecting surface of said photodiode is coated with a coating having a high transmissivity at a wavelength of 532 nm and a high reflectance at wavelength of 1064 nm and 808 nm.

10. The green diode laser, as recited in claim 9, wherein said intracavity frequency doubler is KTP.

11. The green diode laser, as recited in claim 10, wherein said lasing medium is Nd:YVO$_4$.

12. The green diode laser, as recited in claim 11, further comprising a focusing device mounted between said semiconductor chip and said input facet of said lasing medium for focusing of said pumping radiation.

13. The green diode laser, as recited in claim 10, wherein said lasing medium is Nd:GdVO$_4$.

14. The green diode laser, as recited in claim 13, further comprising a focusing device mounted between said semiconductor chip and said input facet of said lasing medium for focusing of said pumping radiation.

15. The green diode laser, as recited in claim 1, wherein said lasing medium and said intracavity frequency doubler are spaced with each other, said input facet of said lasing medium is coated with a coating having a high transmissivity at a wavelength of 808 nm and a high reflectance at wavelength of 1064 nm and 532 nm while a facet of said lasing medium opposite to said input facet is coated with a coating having a high transmissivity at wavelength of 1064 nm and 532 nm said output facet of said intracavity frequency doubler is coated with a coating having a high transmissivity at a wavelength of 532 nm and a high reflectance at a wavelength of 1064 nm while a facet of said intracavity frequency doubler opposite to said output facet is coated with a coating having a high transmissivity at wavelength of 1064 nm and 532 nm.

16. The green diode laser, as recited in claim 15, wherein a filter having a high transmissivity at a wavelength of 532 nm and a high reflectance at wavelength of 1064 nm and 808 nm is covered on the light detecting surface of the photodiode.

17. The green diode laser, as recited in claim 16, wherein said intracavity frequency doubler is KTP.

18. The green diode laser, as recited in claim 17, wherein said lasing medium is Nd:YVO$_4$.

19. The green diode laser, as recited in claim 18, further comprising a focusing device mounted between said semiconductor chip and said input facet of said lasing medium for focusing of said pumping radiation.

20. The green diode laser, as recited in claim 17, wherein said lasing medium is Nd:GdVO$_4$.

21. The green diode laser, as recited in claim 20, further comprising a focusing device mounted between said semiconductor chip and said input facet of said lasing medium for focusing of said pumping radiation.

22. The green diode laser, as recited in claim 1, further comprising a Q-switch crystal supported within said laser casing between said lasing medium and said intracavity frequency doubler for converting said laser beam into a pulsed one.

23. The green diode laser, as recited in claim 1, further comprising a single mode device supported within said laser casing between said lasing medium and said intracavity frequency doubler for converting said laser into a single longitude mode laser.

* * * * *